(12) United States Patent
Chen et al.

(10) Patent No.: US 12,035,503 B2
(45) Date of Patent: Jul. 9, 2024

(54) HEAT DISSIPATION SYSTEM OF PORTABLE ELECTRONIC DEVICE

(71) Applicant: Acer Incorporated, New Taipei (TW)

(72) Inventors: Tsung-Ting Chen, New Taipei (TW); Wen-Neng Liao, New Taipei (TW); Cheng-Wen Hsieh, New Taipei (TW); Yu-Ming Lin, New Taipei (TW); Wei-Chin Chen, New Taipei (TW); Kuang-Hua Lin, New Taipei (TW); Chun-Chieh Wang, New Taipei (TW); Shu-Hao Kuo, New Taipei (TW)

(73) Assignee: Acer Incorporated, New Taipei (TW)

( * ) Notice: Subject to any disclaimer, the term of this patent is extended or adjusted under 35 U.S.C. 154(b) by 372 days.

(21) Appl. No.: 17/471,176

(22) Filed: Sep. 10, 2021

(65) Prior Publication Data

US 2022/0132700 A1 Apr. 28, 2022

(30) Foreign Application Priority Data

Oct. 26, 2020 (TW) .................................. 109137125

(51) Int. Cl.
*H05K 7/20* (2006.01)
(52) U.S. Cl.
CPC ....... *H05K 7/20172* (2013.01); *H05K 7/2039* (2013.01)
(58) Field of Classification Search
CPC .............. H05K 7/20172; H05K 7/2039; G06F 1/1616; G06F 1/203
See application file for complete search history.

(56) References Cited

U.S. PATENT DOCUMENTS

| | | | | |
|---|---|---|---|---|
| 2002/0172008 A1* | 11/2002 | Michael | ................ | H01L 23/467 361/720 |
| 2005/0103477 A1* | 5/2005 | Kim | ........................ | G06F 1/203 165/104.33 |
| 2006/0034055 A1* | 2/2006 | Mok | ........................ | G06F 1/203 361/700 |
| 2008/0093056 A1* | 4/2008 | Hwang | .................. | H01L 23/427 257/E23.099 |
| 2010/0175554 A1* | 7/2010 | Huddleston | ........ | B01D 46/0002 361/679.48 |
| 2010/0195280 A1* | 8/2010 | Huang | .................... | G06F 1/203 361/696 |

(Continued)

FOREIGN PATENT DOCUMENTS

| | | |
|---|---|---|
| CN | 102740658 | 10/2012 |
| TW | 201534203 A * | 9/2015 |
| TW | M575250 | 3/2019 |

*Primary Examiner* — Emmanuel E Duke
(74) *Attorney, Agent, or Firm* — JCIPRNET

(57) ABSTRACT

A heat dissipation system of portable electronic device includes a body, at least one fan and at least one spacing member. At least one heat source of the portable electronic device is arranged in the body. The fan is a centrifugal fan disposed in the body. The fan has at least one flow inlet located in the axial direction and at least one flow outlet located in the radial direction. The spacing member is disposed on at least one of the body or the fan to form a stratified air flow in the body along the axial direction. The stratified air flows into the fan through the flow inlet and out of the fan through the flow outlet respectively.

20 Claims, 15 Drawing Sheets

(56) References Cited

U.S. PATENT DOCUMENTS

| | | | |
|---|---|---|---|
| 2011/0149515 A1* | 6/2011 | Yang | H01L 23/427 |
| | | | 361/760 |
| 2012/0099278 A1* | 4/2012 | Chen | F28D 15/0233 |
| | | | 165/104.26 |
| 2012/0147546 A1* | 6/2012 | Chen | G06F 1/20 |
| | | | 361/679.31 |
| 2013/0114204 A1* | 5/2013 | Nigen | H01L 23/427 |
| | | | 361/679.48 |
| 2013/0240182 A1* | 9/2013 | Wang | G06F 1/203 |
| | | | 454/184 |
| 2017/0199554 A1* | 7/2017 | Chen | H01L 23/38 |
| 2019/0014684 A1* | 1/2019 | Chiang | G06F 1/20 |

* cited by examiner

HEAT DISSIPATION SYSTEM OF PORTABLE ELECTRONIC DEVICE

CROSS-REFERENCE TO RELATED APPLICATION

This application claims the priority benefit of Taiwan application serial no. 109137125, filed on Oct. 26, 2020. The entirety of the above-mentioned patent application is hereby incorporated by reference herein and made a part of this specification.

BACKGROUND

Field of the Disclosure

The disclosure relates to a heat dissipation system, and more particularly to a heat dissipation system of a portable electronic device.

Description of Related Art

With the rapid development of the current electronics industry, the performance of electronic components continues to be improved. As the computing speed increases, the heat that is generated increases as well. Therefore, for portable electronic devices, such as notebook computers, a centrifugal fan is required to exhaust the air from the portable electronic device, thereby reducing the internal temperature of the device.

Furthermore, in order to make devices to be lighter, thinner and have better performance to meet the current trend, the heat dissipation elements in portable electronic devices need to be miniaturized, and therefore, the heat dissipation efficiency is often insufficient.

In the meantime, existing fans are typically provided with only one flow outlet, which has very limited heat dissipation efficiency. On the premise of not increasing the number of fans, although the fan can be designed with two flow outlets, in the case where there is no corresponding air flow route, not only that the fan cannot effectively dissipate the heat, but also the heat dissipation routes are likely to be in conflict in the device. In the meantime, excessive thermal resistance will be generated in the device, which causes heat accumulation and the heat cannot be dissipated from the portable electronic device. For example, if there is no corresponding heat dissipation air flow route, the heat intended to be discharged from the device is likely to be sucked into the device by the fan again.

SUMMARY OF THE DISCLOSURE

The disclosure provides a heat dissipation system for a portable electronic device, which forms a stratified air flow in the body to improve heat dissipation efficiency.

In the disclosure, a heat dissipation system of a portable electronic device includes a body, at least one fan and at least one spacing member. At least one heat source of the portable electronic device is arranged in the body. The fan is a centrifugal fan disposed in the body. The fan has at least one flow inlet located in the axial direction and at least one flow outlet located in the radial direction. The spacing member is disposed on at least one of the body or the fan to form a stratified air flow in the body along the axial direction. The stratified air flows into the fan through the flow inlet and out of the fan through the flow outlet respectively.

Based on the above, the heat dissipation system of the portable electronic device utilizes the centrifugal fan or the spacing member arranged in the body to form a stratified air flow in the body along the axial direction, so as to ensure that the heat dissipation airflow routes generated by the fan are not in conflict. In this manner, it is possible to effectively avoid the possibility that the heat generated by the heat source is sucked in by the fan again, so as to provide a strategy for improving the heat accumulation problem in the existing body caused by the conflict between the heat dissipation routes.

In order to make the above-mentioned features and advantages of the disclosure more obvious and comprehensible, the embodiments are described below with reference to the accompanying drawings for detailed description as follows.

DESCRIPTION OF EMBODIMENTS

Figure 1:
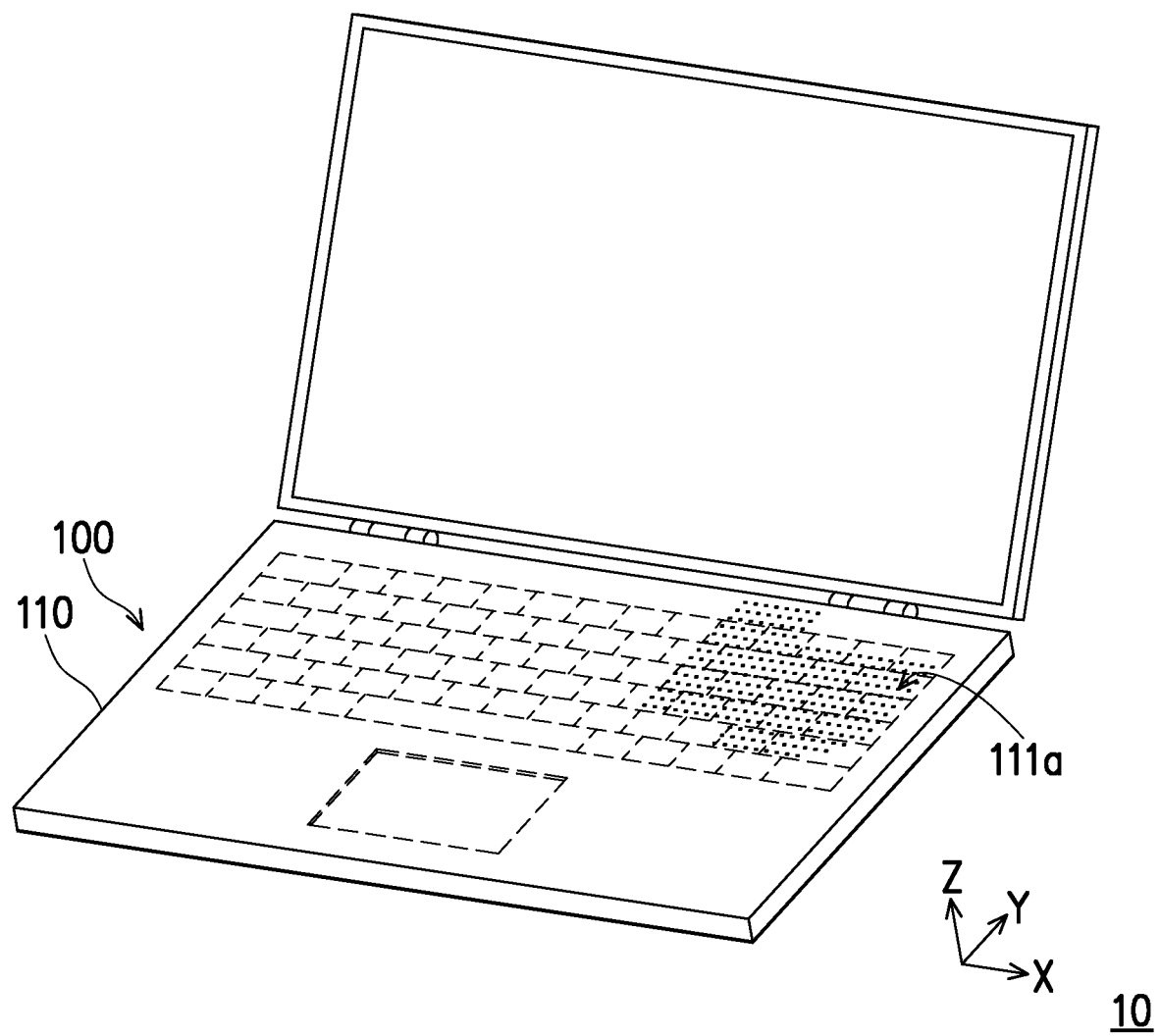
FIG. 1 is a schematic diagram of a portable electronic device according to a first embodiment of the disclosure.
Figure 2A:
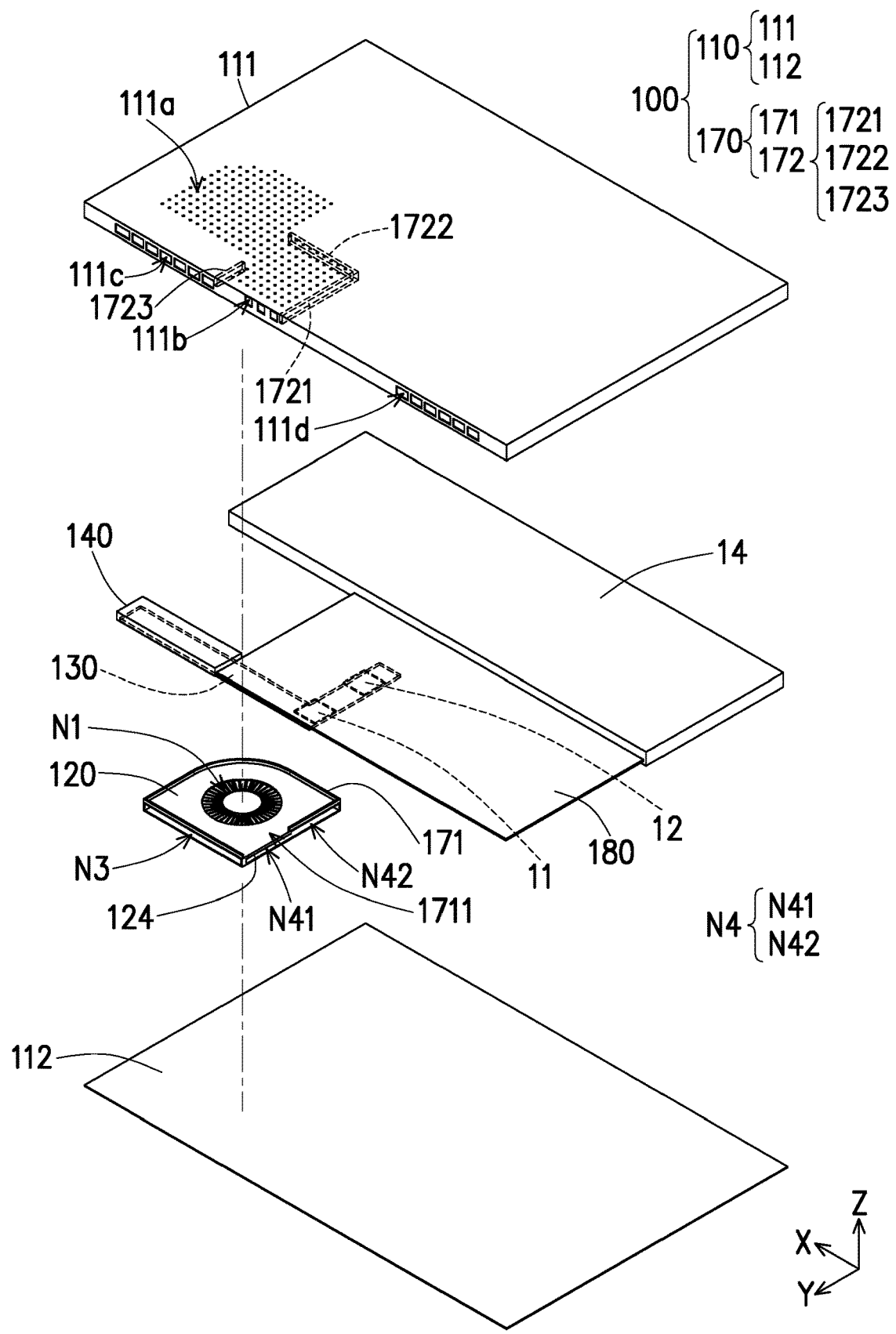
FIG. 2A is an exploded view of the heat dissipation system according to the first embodiment of the disclosure.
Figure 2B:
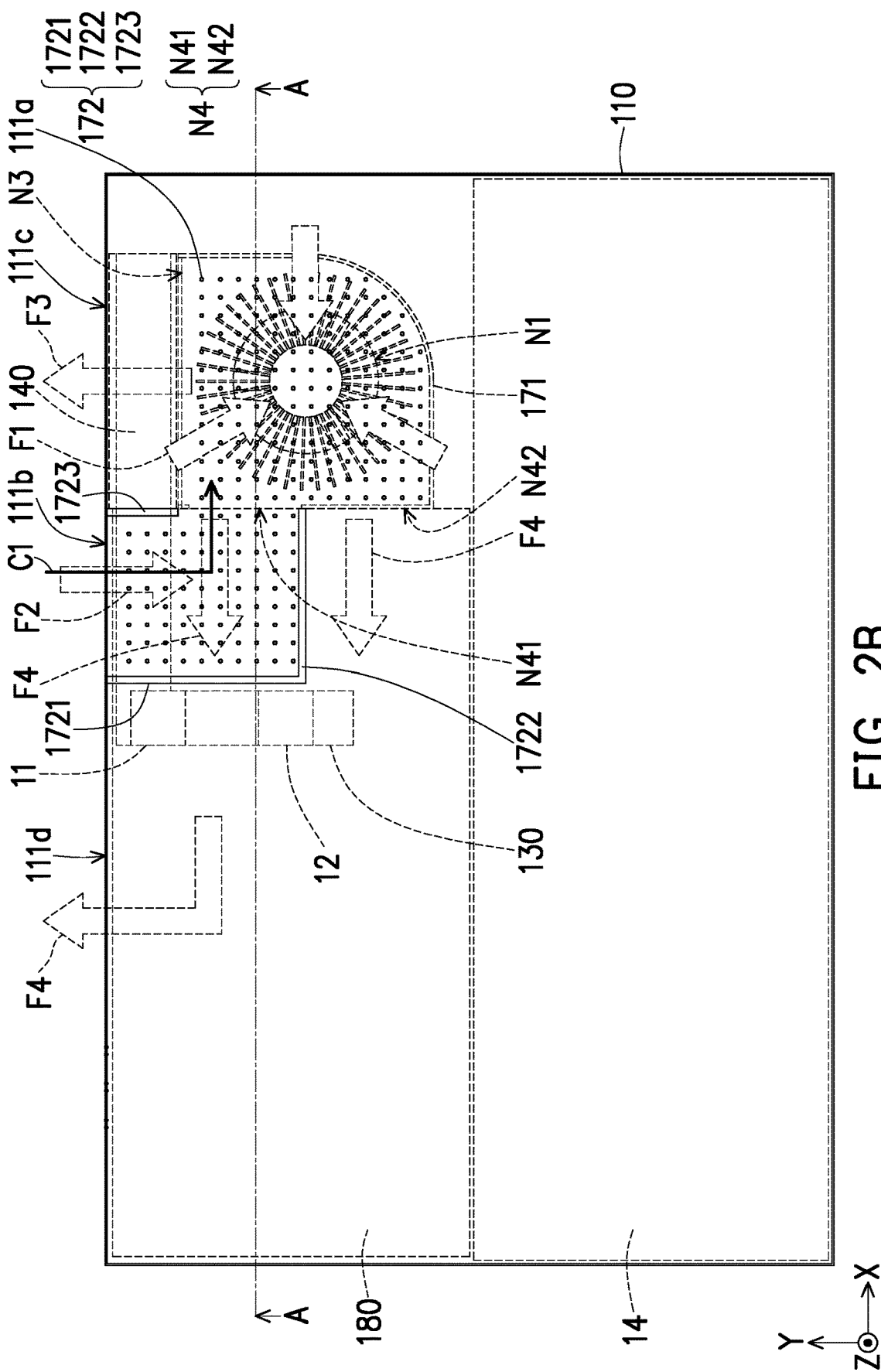
FIG. 2B is a top view of the heat dissipation system of FIG. 2A.

FIG. 1 is a schematic diagram of a portable electronic device according to a first embodiment of the disclosure. FIG. 2A is an exploded view of the heat dissipation system according to the first embodiment of the disclosure. FIG. 2B is a top view of the heat dissipation system of FIG. 2A. This embodiment also provides rectangular coordinates X-Y-Z to facilitate distinguishing components. Please also refer to FIG. 1 to FIG. 2B. In this embodiment, the heat dissipation system 100 is suitable for a portable electronic device 10 (such as a notebook computer). The heat dissipation system 100 includes a body 110, at least one fan 120, and at least one spacing member 170. At least one heat source of the portable electronic device 10 is disposed in the body 110. This embodiment shows two heat sources 11 and 12, which are, for example, a CPU and a GPU. The fan 120 is a centrifugal fan, which is disposed in the body 110. The fan 120 has at least one flow inlet located in the axial direction (according to the current FIG. 2A, the fan 120 has a flow inlet N1) and at least one flow outlet located in the radial direction (according to the current FIG. 2A, the fan 120 has a second flow outlet N3, a first flow outlet N4). The spacing member 170 is disposed on at least one of the body 110 or the fan 120 to form a stratified air flow in the body 110 along the axial direction. The stratified air flow flows into the fan 120 through the flow inlet N1 and out of the fan 120 through the flow outlet (i.e., the second flow outlet N3 and the first flow outlet N4). Here, the axial direction of the fan 120 is the Z-axis axial direction of the rectangular coordinates X-Y-Z.

Figure 2C:
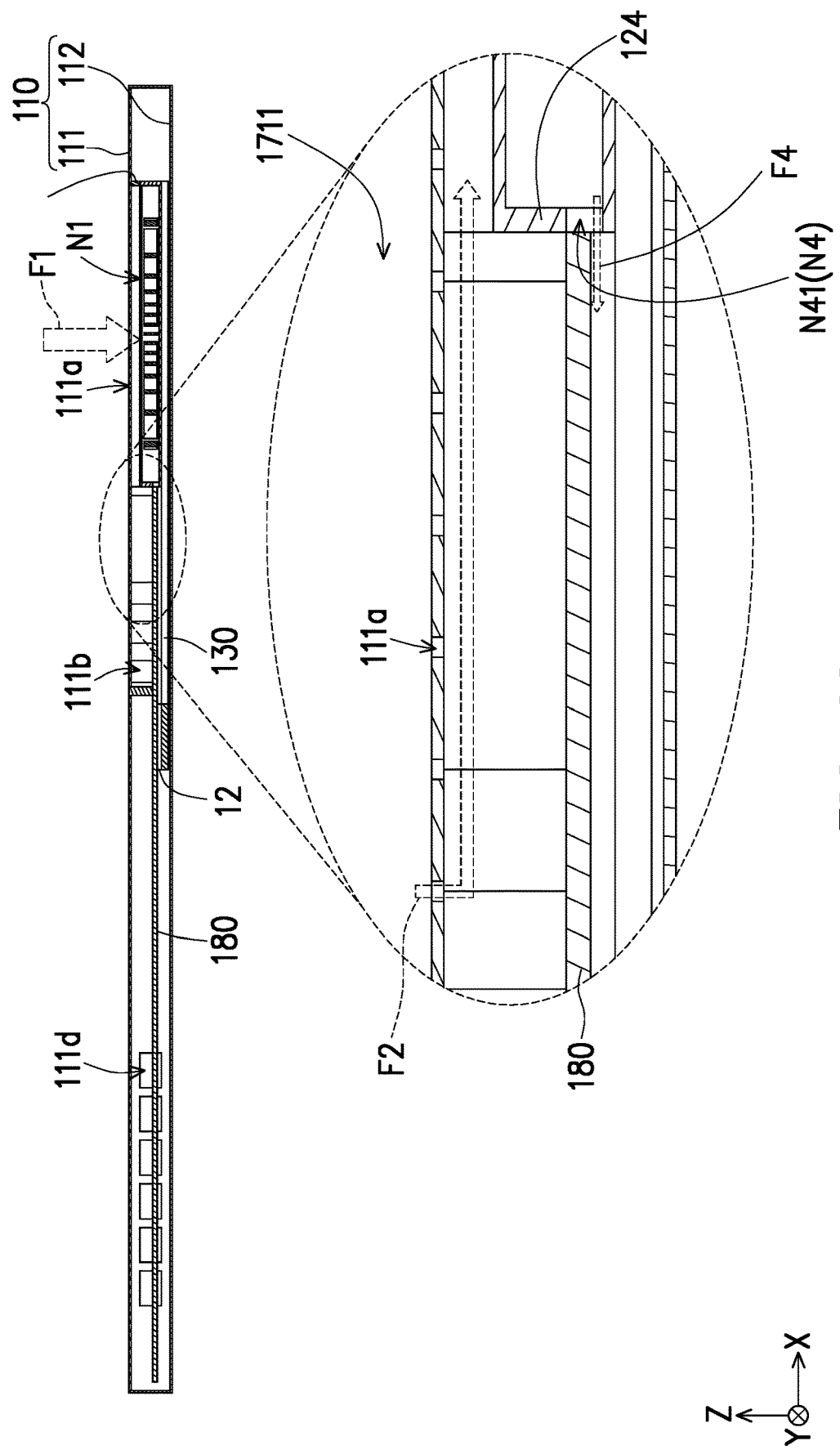
FIG. 2C is a cross-sectional view of the heat dissipation system of FIG. 2B.

FIG. 2C is a cross-sectional view of the heat dissipation system of FIG. 2B. Please refer to FIG. 2A to FIG. 2C, specifically, the body 110 includes an upper housing 111 and a lower housing 112. The upper housing 111 has a (hole-shaped) opening 111a corresponding to the flow inlet N1 of the fan 120. Accordingly, the air in the external environment of the body 110 can flow into the fan 120 through the opening 111a and the flow inlet N1.

In this embodiment, the heat dissipation system 100 further includes a circuit board 180, and the spacing member 170 includes a first spacing member 171 disposed on a part of the periphery of the fan 120 and a second spacing member 172 disposed on the inner wall of the body 110. The spacing member 171, the second spacing member 172, the body 110, the fan 120, and the circuit board 180 form an inflow channel C1, and the inflow channel C1 is connected to the flow inlet N1. The first spacing member 171 is a buffering material, such as foam, which has flexibility and elasticity to abut against the upper housing 111, so that the flow inlet N1 in the body 110 and the heat sources 11 and 12 in the body 110 (along Z axis) are separated by upper and lower spaces. In other words, the orthographic projection of the inflow channel C1 on the Z axis and the orthographic projection of the flow outlet (the aforementioned N3 and N4) on the Z axis are staggered, thereby ensuring that the heat generated by the heat sources 11 and 12 does not affect the space where the flow inlet N1 is located. That is, the flow inlet N1 can only suck in air from the external environment through the opening 111a of the body 110, which ensures that the fan 120 sucks in cool air, and when the cool air is blown out from the flow outlet, the heat sources 11 and 12 can be effectively cooled.

Specifically, in this embodiment, the inflow channel C1 and the first flow outlet N4 facing the inside of the body 110 are located on the same side of the fan 120 (that is, in the same radial direction). Please refer to FIG. 2A, further, the first spacing member 171 forms a notch 1711 on the fan 120, and the notch 1711 and the first flow outlet N4 are located on the same side of the fan 120 (that is, the same radial direction). In this embodiment, the second flow outlet N3 of the fan 120 faces the outside of the body 110, the first flow outlet N4 faces the inside of the body 110, and the second flow outlet N3 and the first flow outlet N4 have different opening sizes along the Z-axis direction. In this embodiment, the opening size of the first flow outlet N4 in the axial direction is smaller than the opening size of the second flow outlet N3 in the axial direction. However, in other embodiments, the second flow outlet N3 and the first flow outlet N4 may also have the same opening size in the axial direction, the disclosure provides no limitation thereto.

In this embodiment, the second spacing member 172 includes three second sub-spacing members 1721, 1722 and 1723, which surround a part of the opening 111a to collect the air flow sucked from the opening 111a. The second sub-spacing member 1722 is connected to the second sub-spacing member 1721 and extends to the first spacing member 171 to smoothly guide the air flow sucked in from the opening 111a to the flow inlet N1. In this embodiment, the distance between the two second sub-spacing members 1722 and 1723 corresponds to the width of the notch 1711.

Specifically, the first flow outlet N4 facing the inside of the body 110 has a first sub-flow outlet N41 and a second sub-flow outlet N42. The opening size of the first sub-flow outlet N41 along the Z axis is smaller than the opening size of the second sub-flow outlet N42 along the Z axis. In this embodiment, the fan 120 further has a side wall 124 located between the first sub-flow outlet N41 and the inflow channel C1 along the Z axis. In other words, the orthographic projections of the side wall 124 and the first sub-flow outlet N41 are adjacent to the orthographic projection of the inflow channel C1 along the Z axis. The bottom of the side wall 124 abuts against the circuit board 180. The advantage of this design is that the circuit board 180 and the side wall 124 can achieve the effect of separating the notch 1711 from the first sub-flow outlet N41, and it is possible to prevent the air blown out of the first sub-flow outlet N41 from being easily sucked in by the fan 120 through the notch 1711 and the flow inlet N1. In addition, the lower housing 112 of the embodiment does not have an opening, so an aesthetic effect can be achieved on the back side, so that the portable electronic device 10 has a better appearance.

Please refer to FIG. 2B and FIG. 2C again. Generally speaking, the body 110 of this embodiment has at least one opening, and the air flow generated by the fan 120 flows out from the flow outlet and dissipates heat from the heat sources 11 and 12 or related heat dissipation components, and then flows out of the body 110 from the opening. In detail, the fan 120 in this embodiment operates to suck in cool air, that is, the air flow F1 as shown in the figure, from the environment outside the body 110 through the flow inlet N1. Furthermore, as shown in FIG. 2A, FIG. 2B, and FIG. 2C, the body 110 has a plurality of openings 111c and 111d, the portable electronic device 10 further includes a battery 14, and the heat dissipation system 100 also has a heat conducting element 130 and a heat dissipation element 140. The heat sources 11 and 12 are arranged on the lower surface of the circuit board 180. As shown in FIG. 2A and FIG. 2B, the heat conducting element 130 is, for example, a heat pipe, and the heat dissipation element 140 is, for example, a heat dissipation fin (the drawings in this embodiment are only for exemplary purpose). The heat conducting element 130 is in thermal contact between the heat sources 11 and 12 and the heat dissipation element 140 to transfer the heat generated by the heat sources 11 and 12 to the heat dissipation element 140. In addition, because the fan 120 has a first flow outlet N4 and a second flow outlet N3, the air flows F3 and F4 generated by the fan 120 respectively flow out of the second flow outlet N3 and the first flow outlet N4. The heat dissipation element 140 is located between the second flow outlet N3 and the opening 111c, wherein the air flow F3 flowing from the second flow outlet N3 flows out of the body 110 from the opening 111c through the heat dissipation element 140, and the air flow F4 flowing from the first flow outlet N4 passes through the heat sources 11 and 12 and then flows out of the body 110 through the opening 111d.

In this way, the cool air sucked into the fan 120 can flow out from the first flow outlet N4 and the second flow outlet N3 respectively, and the cool air (air flow F4) flowing out from the first flow outlet N4 can directly blow the heat sources 11 and 12 in the body 110 to dissipate heat, and then flow out of the body 110 through the opening 111d of the body 110. The cool air (air flow F3) flowing out of the second flow outlet N3 blows the heat dissipation element 140 and dissipates heat, and then flows out of the body 110 through the opening 111*c* of the body 110. In other words, the heat generated by the heat sources 11 and 12 can be dissipated through the above two non-conflicting routes, which can obviously improve the heat dissipation efficiency of the heat dissipation system 100.

Figure 3A:
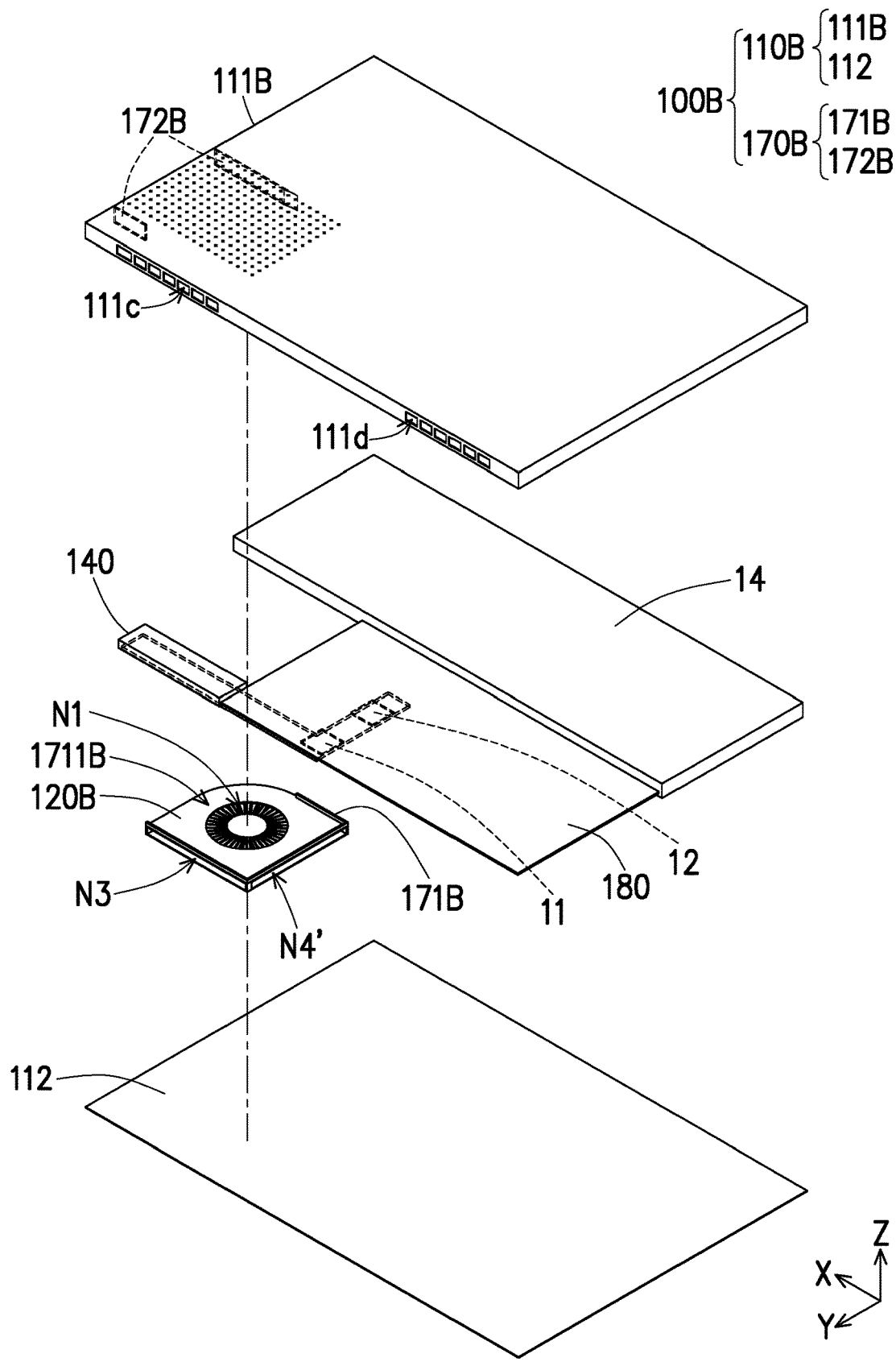
FIG. 3A is an exploded view of the heat dissipation system according to the second embodiment of the disclosure.
Figure 3B:
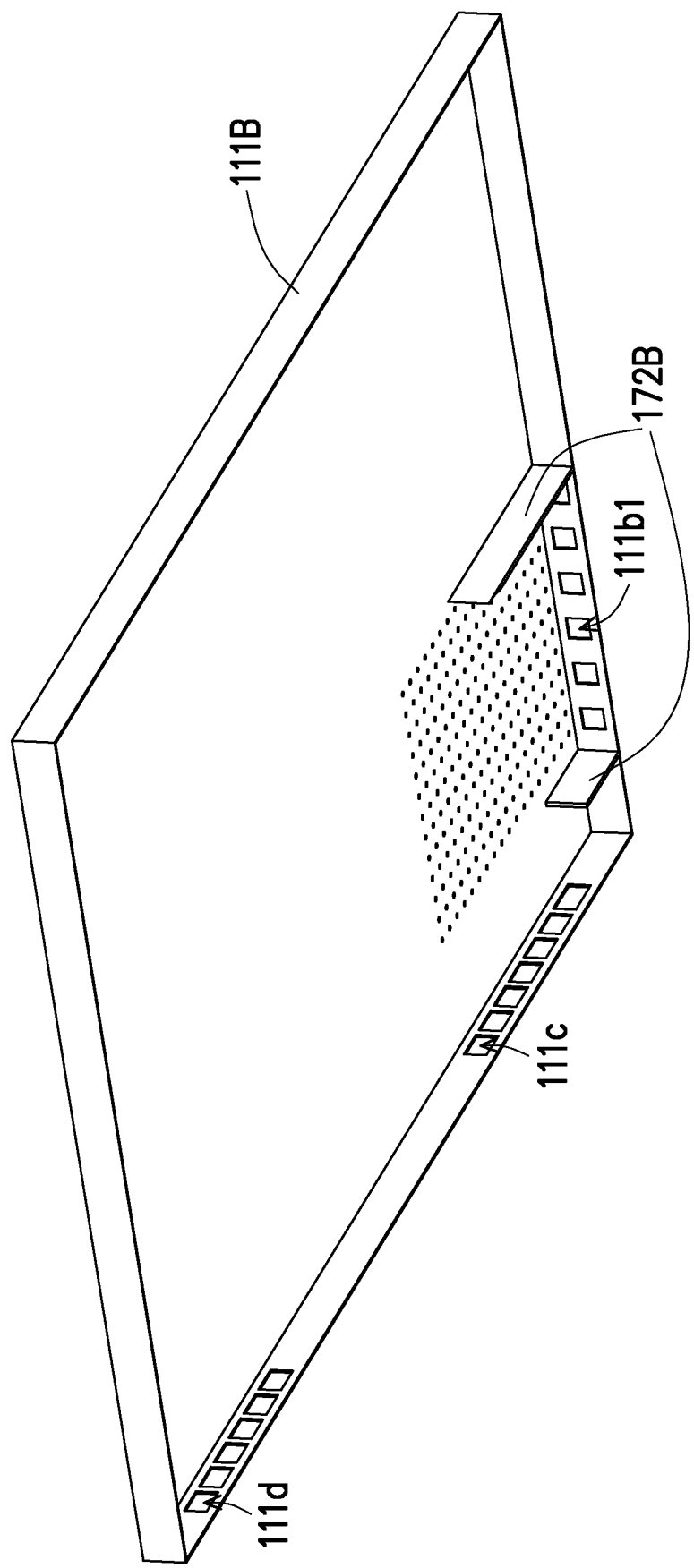
FIG. 3B is a schematic diagram showing the upper housing of FIG. 3A from a different viewing angle.
Figure 3C:
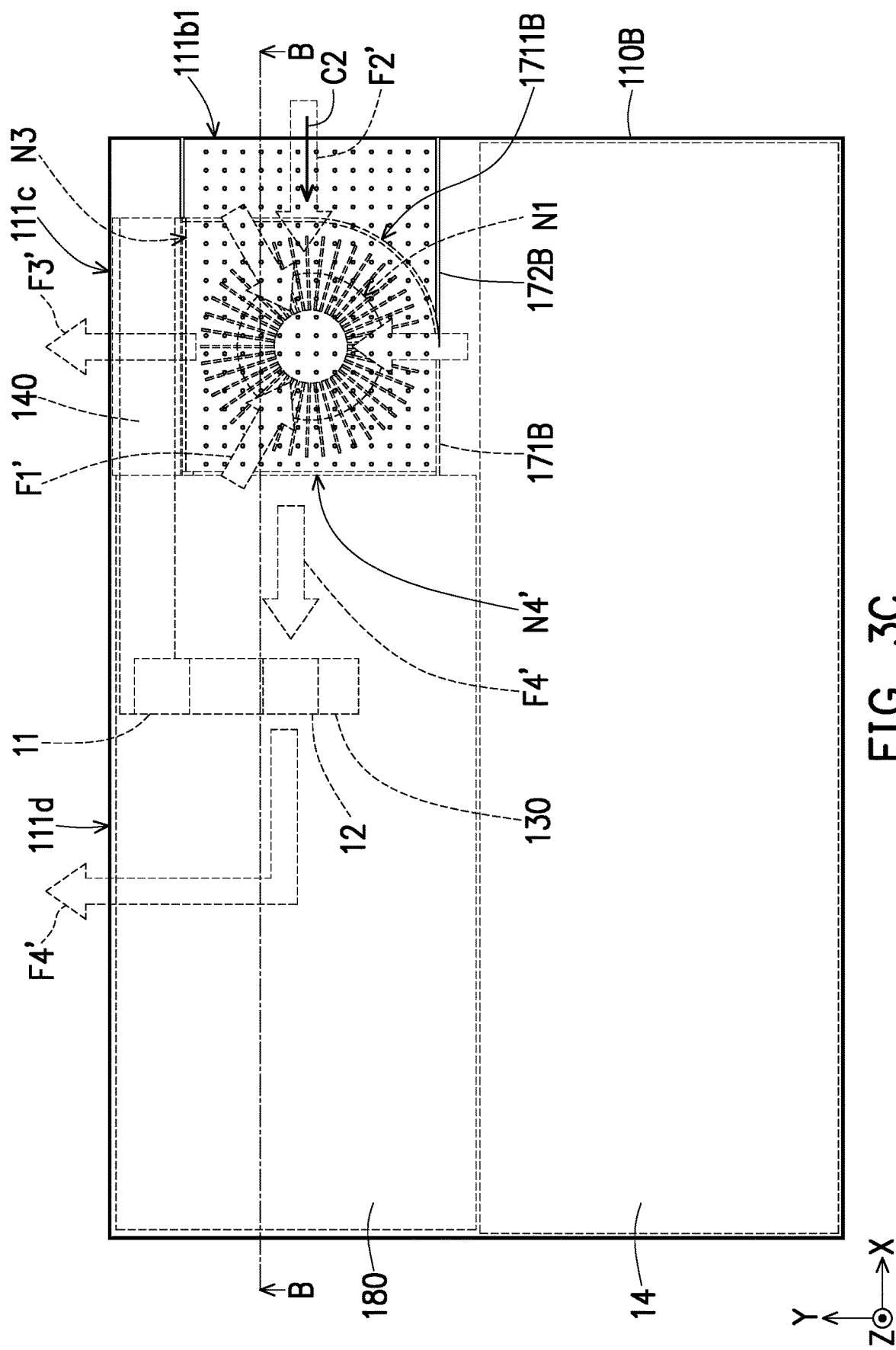
FIG. 3C is a top view of the heat dissipation system of FIG. 3A.

FIG. 3A is an exploded view of the heat dissipation system according to the second embodiment of the disclosure. FIG. 3B is a schematic diagram showing the upper housing of FIG. 3A from a different viewing angle. FIG. 3C is a top view of the heat dissipation system of FIG. 3A. Different from the openings 111*b*, 111*c* and 111*d* on the upper housing 111 in the foregoing embodiment that are located on the same side of the body 110, in the embodiment shown in FIG. 3A to FIG. 3C, the position of the opening 111*b*1 is obviously different from the openings 111*c* and 111*d*. In other words, in this embodiment, the opening 111*b*1 for sucking in cool air from the external environment is disposed far away from the openings 111*c* and 111*d* for exhausting air flow, which facilitates to prevent the air flowing out through the openings 111*c* and 111*d* from being easily sucked in by the fan 120 through the opening 111*b*1. In addition, in this embodiment, the two air flow outlets N3 and N4' of the fan 120B have the same opening size along the Z axis.

Figure 3D:
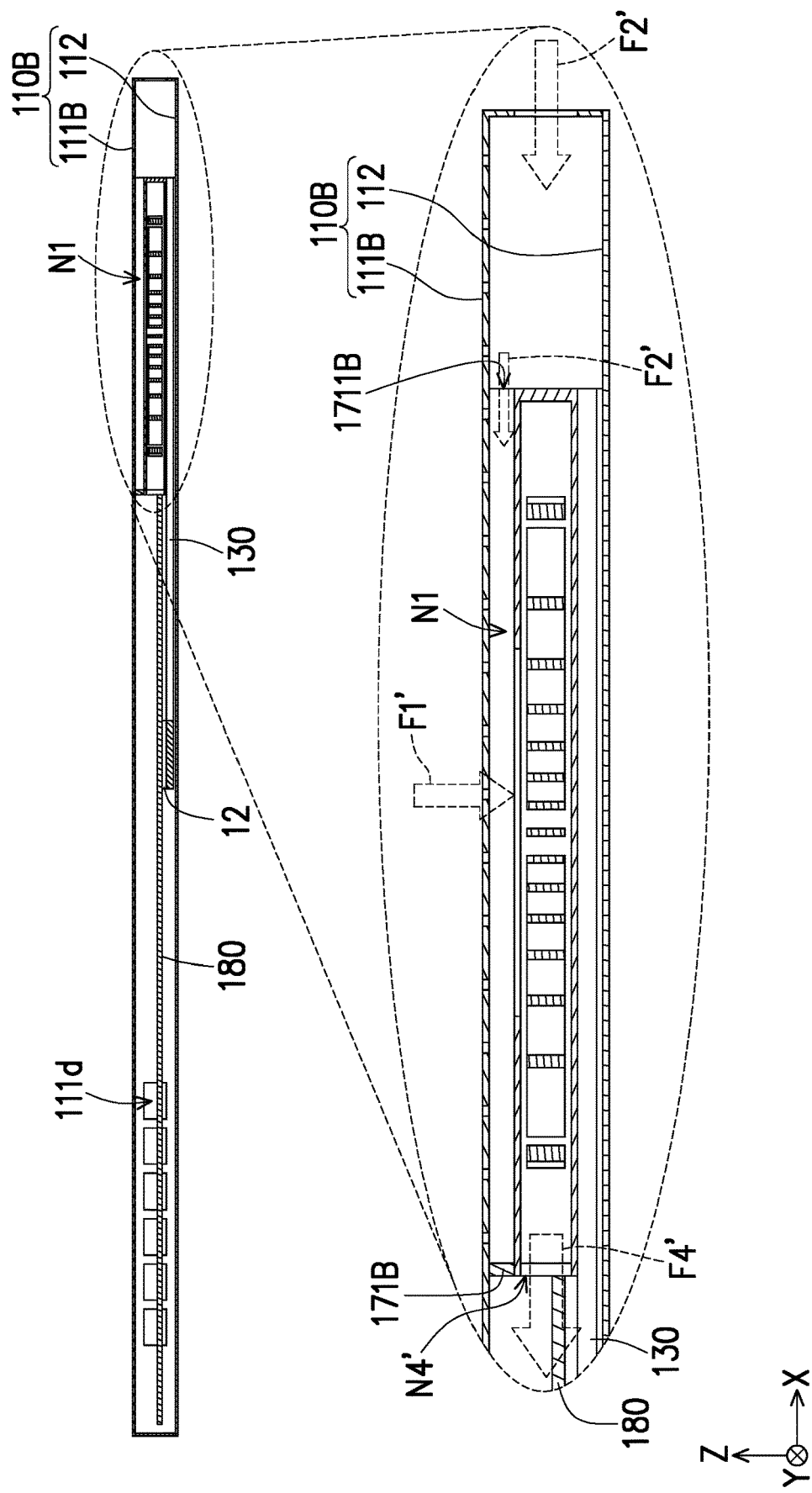
FIG. 3D is a partial cross-sectional view of the heat dissipation system of FIG. 3C.

FIG. 3D is a partial cross-sectional view of the heat dissipation system of FIG. 3C. Please refer to FIG. 3A to FIG. 3D. Further, in this embodiment, the spacing member 170B includes a first spacing member 171B disposed on a part of the periphery of the fan 120B and at least one second spacing member 172B (two are shown in the figure) disposed on the inner wall of the body 110B. In this embodiment, the two second spacing members 172B are respectively located on both sides of the opening 111*b*1 to collect the air flow sucked in from the opening 111*b*1, and the two second spacing members 172B extend to the first spacing member 171B to smoothly guide the air flow sucked in from the opening 111*b*1 to the flow inlet N1. In this embodiment, the distance between the two second spacing members 172B corresponds to the width of the notch 1711B. The first spacing member 171B, the second spacing member 172B, the body 110B, and the fan 120B form an inflow channel C2, and the inflow channel C2 is connected to the flow inlet N1.

Specifically, the inflow channel C2 and the first flow outlet N4' facing the inside of the body 110 are located on opposite sides of the fan 120B. The first spacing member 171B forms a notch 1711B on the outer surface of the fan 120B, and the notch 1711B and the first flow outlet N4' are located on different sides of the fan 120B.

Generally speaking, the fan 120B of the embodiment operates to suck in cool air, that is, the air flow F1' as shown in the figure, from the outer environment of the body 110 through the flow inlet N1. The cool air, that is, the air flow F2' as shown in the figure, in the outer environment of the body 110 is sucked through the opening 111*b*1. Furthermore, because the fan 120B has a first flow outlet N4' and a second flow outlet N3, the air flows F3' and F4' generated by the fan 120 respectively flow out from the second flow outlet N3 and the first flow outlet N4', wherein the air flow F3' flowing out of the second flow outlet N3 passes through the heat dissipation element 140 and flows out of the body 110 through the opening 111*c*, and the air flow F4' flowing out of the first flow outlet N4' passes through the heat sources 11 and 12 and then flows out of the body 110 through the opening 111*d*.

Figure 4A:
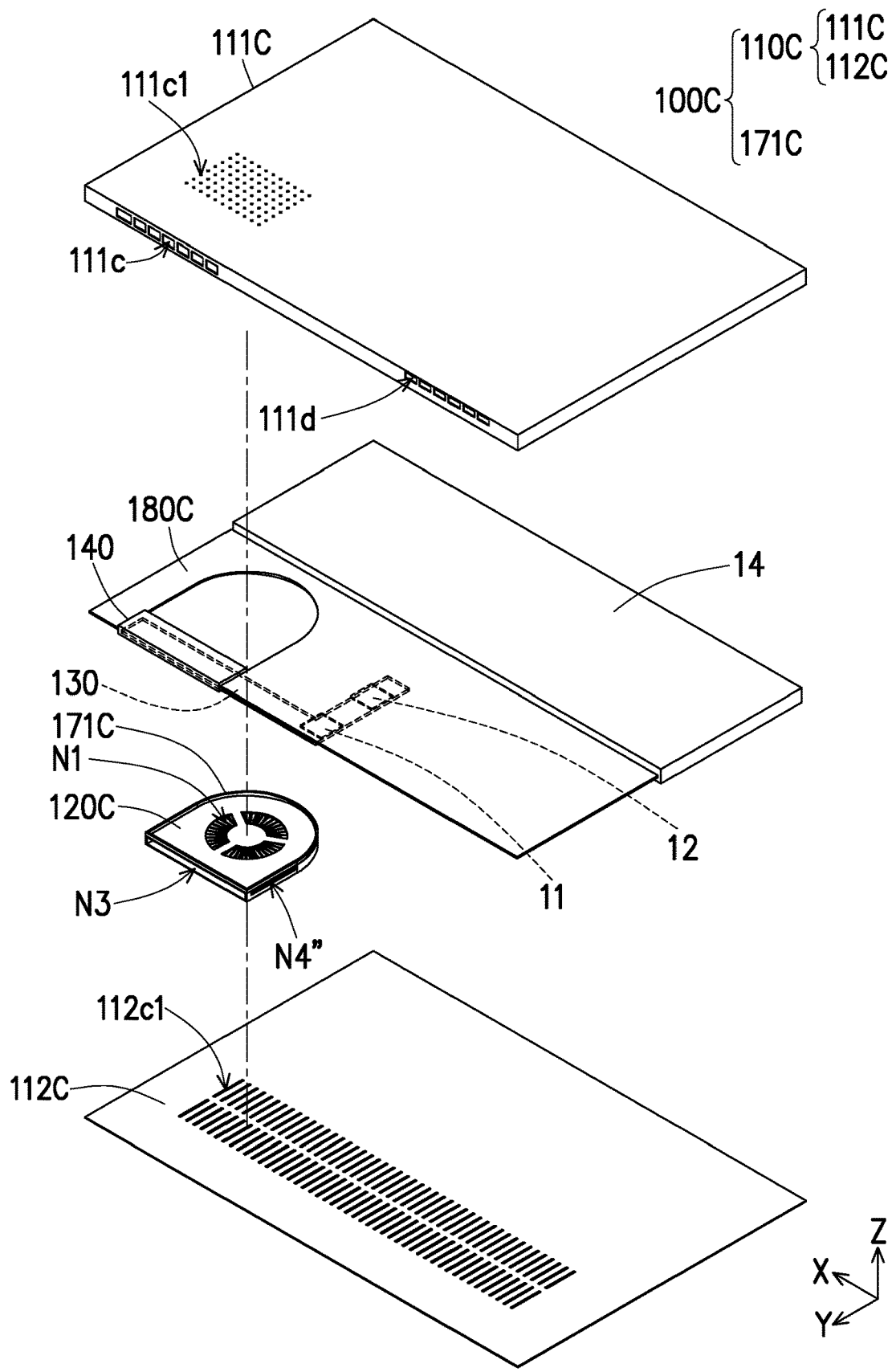
FIG. 4A is an exploded view of the heat dissipation system according to the third embodiment of the disclosure.
Figure 4B:
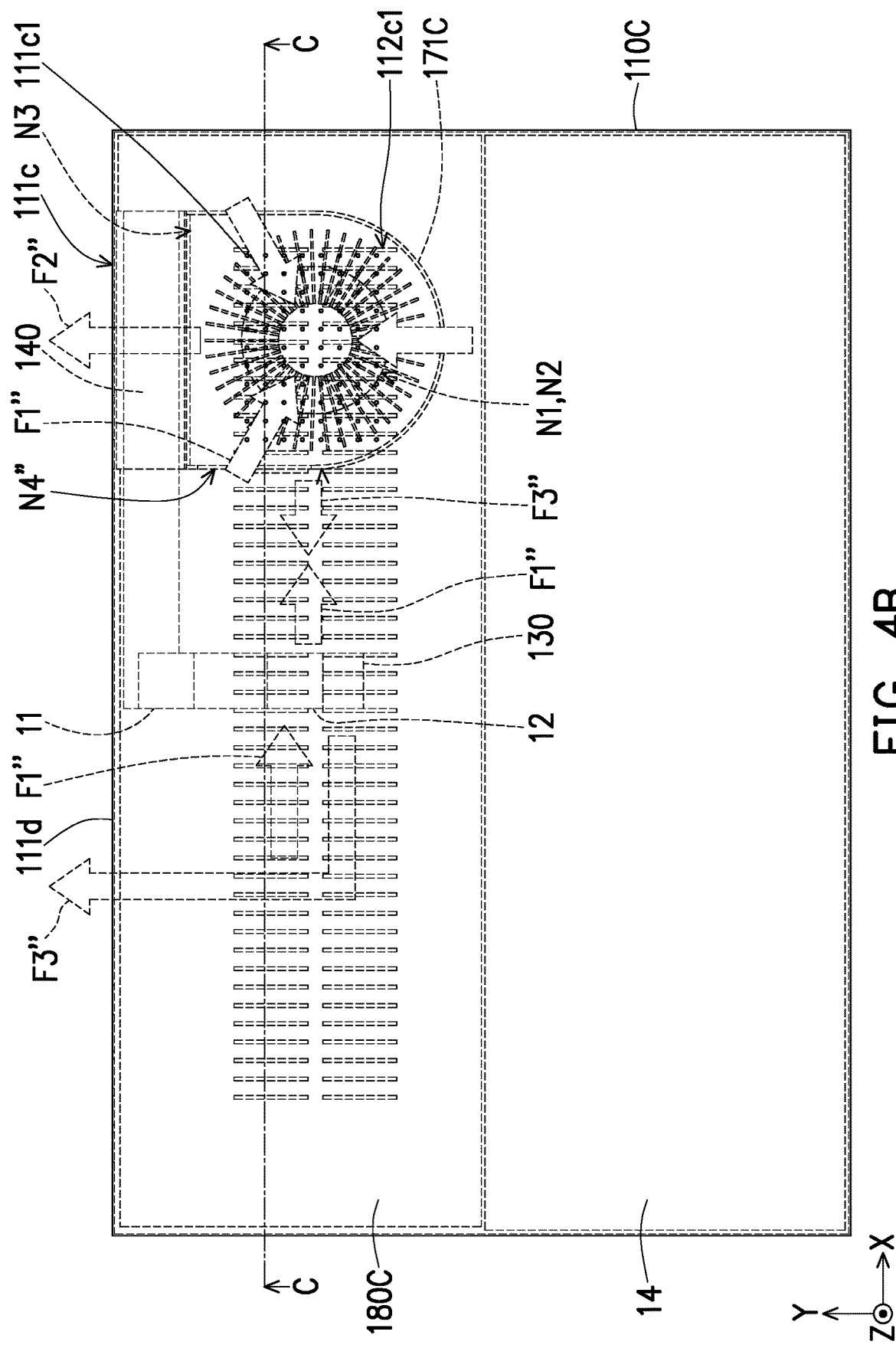
FIG. 4B is a top view of the heat dissipation system of FIG. 4A.
Figure 4C:
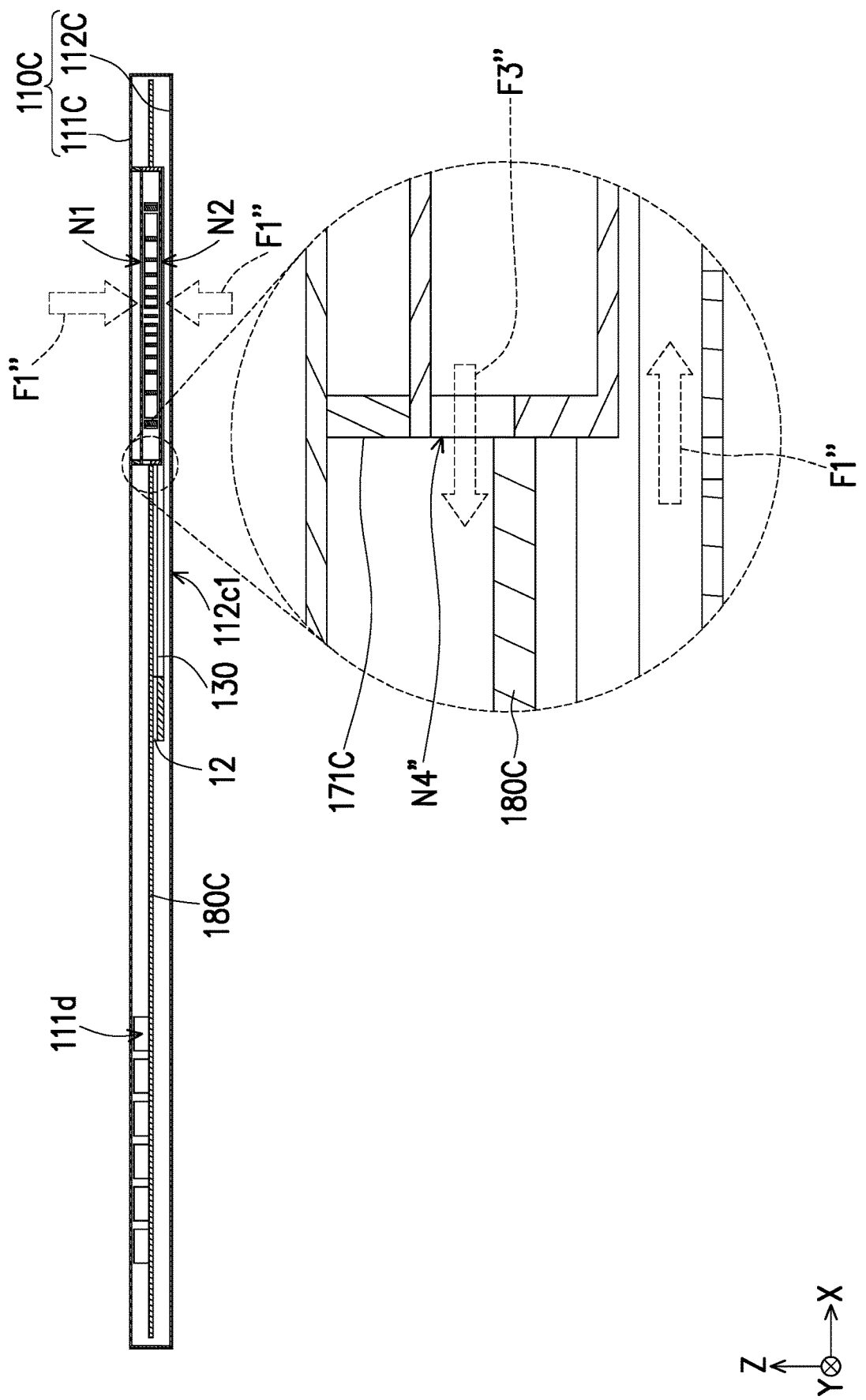
FIG. 4C is a partial cross-sectional view of the heat dissipation system of FIG. 4B.

FIG. 4A is an exploded view of the heat dissipation system according to the third embodiment of the disclosure. FIG. 4B is a top view of the heat dissipation system of FIG. 4A. FIG. 4C is a partial cross-sectional view of the heat dissipation system of FIG. 4B. Different from the circuit board 180 shown in FIG. 2A to FIG. 2C that abuts against one side of the fan 120, in the embodiment shown in FIG. 4A to FIG. 4C, the circuit board 180C is disposed in the body 110C and annularly connected to at least a part of the fan 120C to stratify the internal space of the body 110C. The first flow outlet N4" is located on one of the layers. For example, the first flow outlet N4' is disposed on the circuit board 180C, and the heat sources 11 and 12 are disposed under the circuit board 180C. In other words, the spacing member of this embodiment is the circuit board 180C.

In this embodiment, the fan 120C further has another flow inlet N2 relative to the flow inlet N1, and the flow inlet N1 and the flow inlet N2 are located on opposite sides of the fan 120C along the Z axis. Furthermore, the lower housing 112C of the body 110C has a (grid-shaped) opening 112*c*1 corresponding to the flow inlet N2. Accordingly, the air in the external environment of the body 110C can flow into the fan 120C through the openings 111*c*1 and 112*c*1 as well as the flow inlets N1 and N2.

In this embodiment, the fan 120C abuts against the lower housing 112C of the body 110C along the Z axis. The heat dissipation system 100C of the portable electronic device 10 includes a first spacing member 171C, being arranged along the periphery of the fan 120C and abutting between the fan 120C and the body 110C. The first spacing member 171C is, for example, foam, which has flexibility and elasticity to abut against the upper housing 111C, so that the space in the body 110C where the flow inlets N1 and N2 are located is isolated and independent from the space in the body 110 where the heat sources 11 and 12 are located. In this manner, it can be ensured that the heat generated by the heat sources 11 and 12 will not affect the space where the flow inlets N1 and N2 are located. That is, the flow inlets N1 and N2 can only suck in the air in the outer environment through the openings 111*c*1 and 112*c*1 of the body 110C, which ensures that the fan 120C sucks in cool air. In this manner, it is possible for the cool air to effectively dissipate heat generated by the heat sources 11 and 12 when flowing out from the second flow outlet N3 and the first flow outlet N4". Here, the flow inlets N1 and N2 of the fan 120C are arranged coaxially, and as shown in FIG. 4A, the buffering material 171C is arranged along the structural periphery of the fan 120 to form a closed contour.

In this embodiment, the heat dissipation system 100C of the portable electronic device 10C further includes a heat dissipation fin 140. The entire fan 120C, except for the flow outlet N3 facing the outside of the body 110C, is annularly connected to the circuit board 180C. The heat dissipation fin 140 is arranged in the body 110C and faces forward the flow outlet N3 facing the outside of the body 110C. The heat dissipation fin 140 and the circuit board 180C form a closed contour, and the fan 120C is located in the closed contour, and the inside of the body 110C is divided into two spaces.

Generally speaking, the fan 120C of this embodiment operates to suck in cool air, that is, the air flow F1" as shown in the figure, from the outer environment of the body 110C through the flow inlets N1 and N2. Furthermore, because the fan 120C has the first flow outlet N4" and the second flow outlet N3, the airflows F2" and F3" generated by the fan 120C flow through the second flow outlet N3 and the first flow outlet N4" respectively. The heat dissipation element 140 is located between the second flow outlet N3 and the opening 111c. The airflow F2" flowing from the second flow outlet N3 passes through the heat dissipation element 140 and flows out of the body 110C through the opening 111c, and the airflow F3" flowing from the first flow outlet N4" passes through the heat sources 11 and 12 and then flows out of the body 110C through the opening 111d.

Figure 5A:
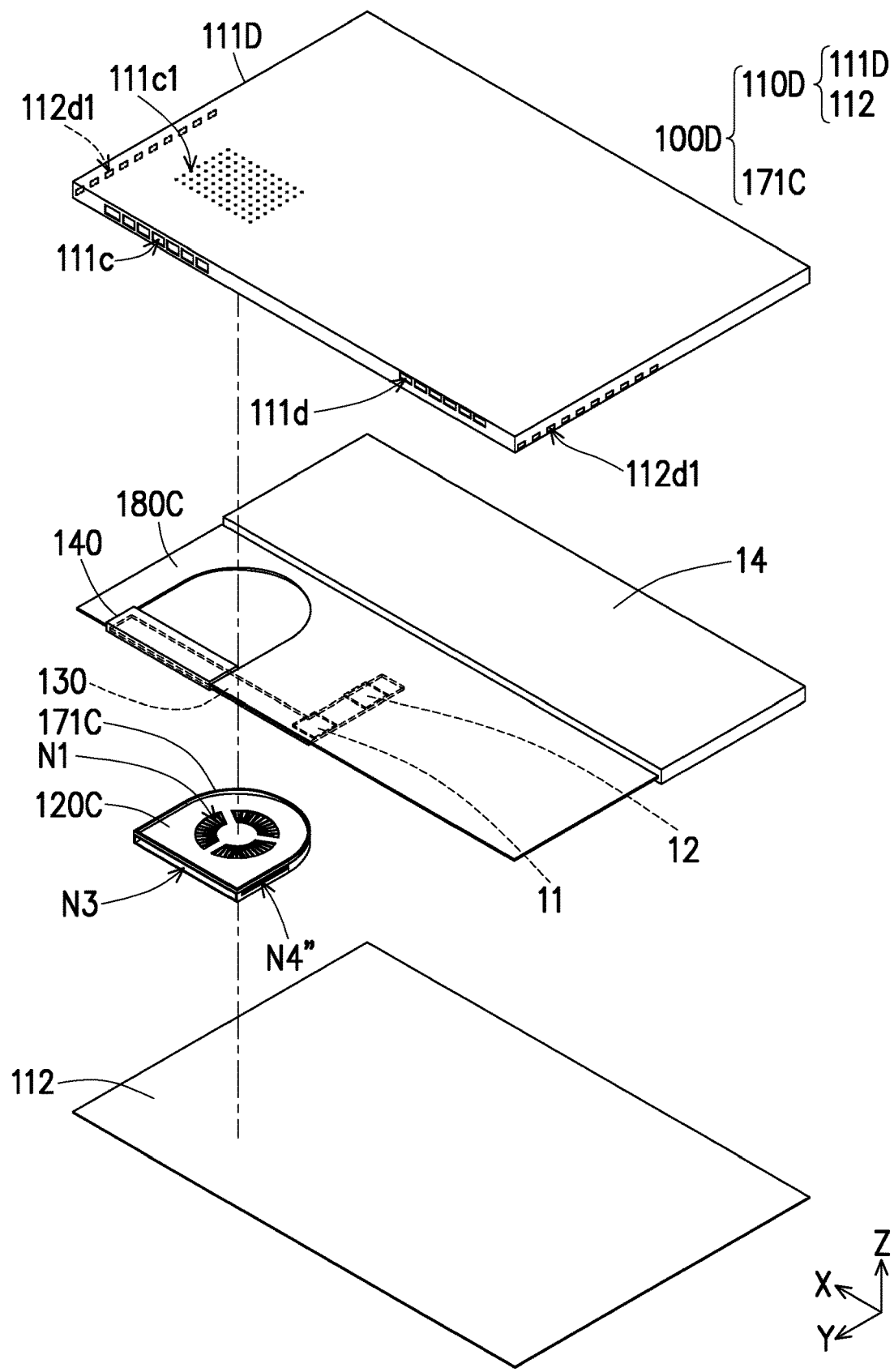
FIG. 5A is an exploded view of the heat dissipation system according to the third embodiment of the disclosure.
Figure 5B:
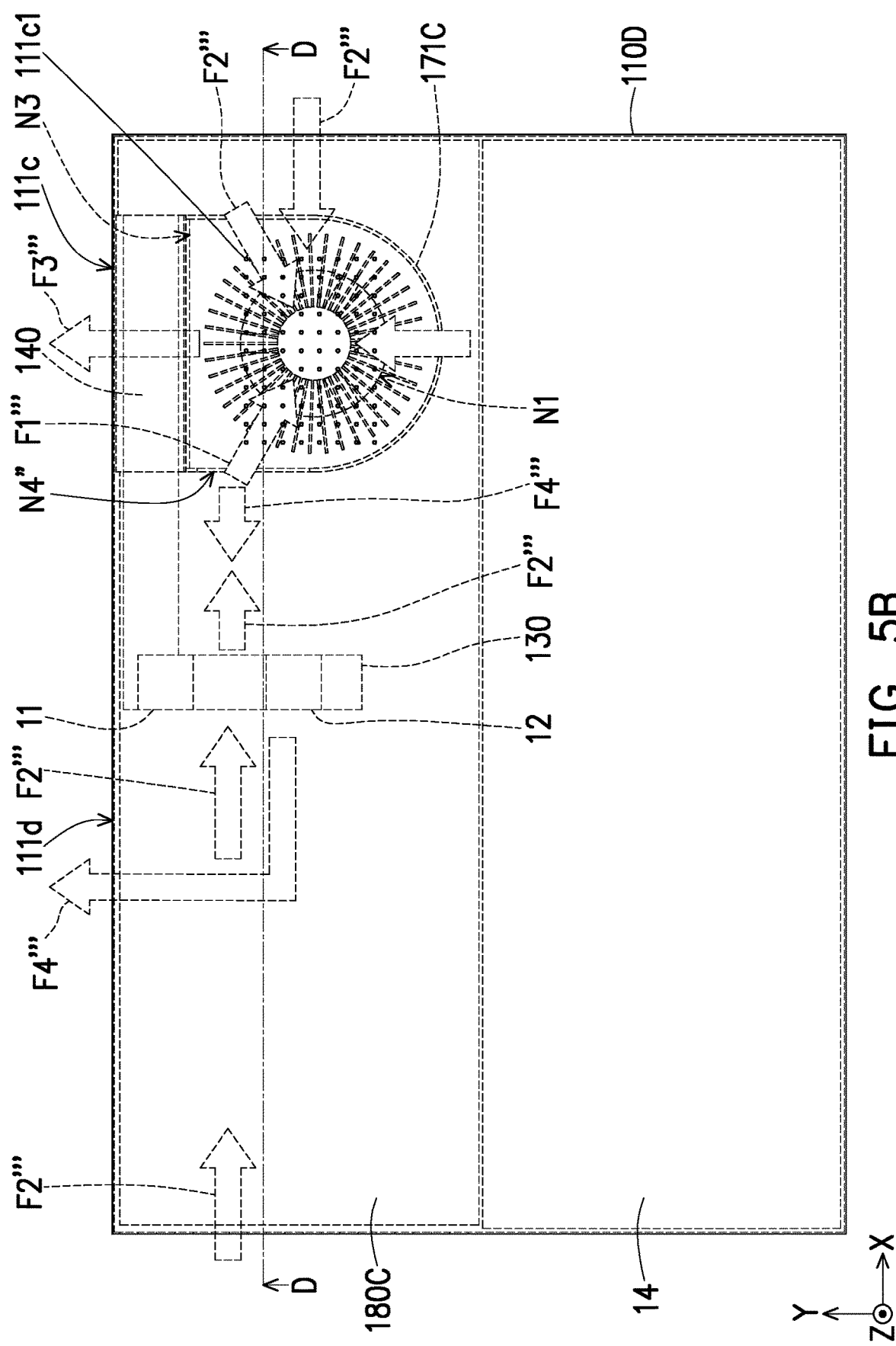
FIG. 5B is a top view of the heat dissipation system of FIG. 5A.
Figure 5C:
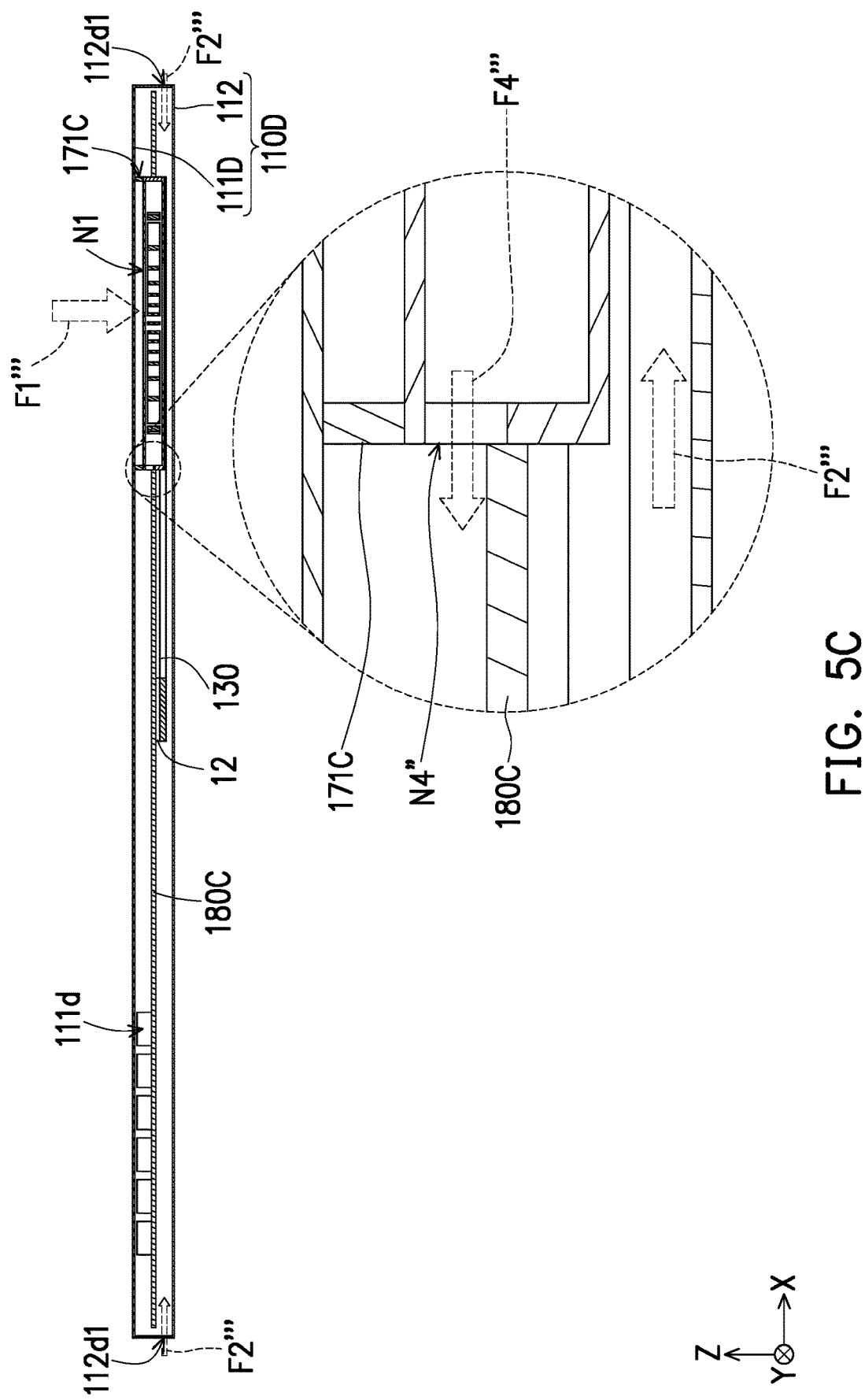
FIG. 5C is a partial cross-sectional view of the heat dissipation system of FIG. 5B.

FIG. 5A is an exploded view of the heat dissipation system according to the third embodiment of the disclosure. FIG. 5B is a top view of the heat dissipation system of FIG. 5A. FIG. 5C is a partial cross-sectional view of the heat dissipation system of FIG. 5B. Different from the lower housing 112C shown in FIG. 4A to FIG. 4C that has a (grid-shaped) opening 112c1, in the embodiment shown in FIG. 5A to FIG. 5C, the circuit board 180C stratifies the internal space of the body 110D, and the first flow outlet N4" is located at one of the layers, that is, above the circuit board 180C. The opening 112d1 of the lower housing 111D is located on another layer without the first flow outlet N4", that is, under the circuit board 180C.

Generally speaking, the fan 120C of this embodiment operates to suck in cool air, that is, the air flow F1'" as shown in the figure, from the outer environment of the body 110C through the flow inlet N1. The cool air, that is, the air flow FT' as shown in the figure, in the outer environment of the body 110D is sucked through the opening 112d1. Furthermore, because the fan 120C has a first flow outlet N4" and a second flow outlet N3, the air flows F4'" and F3'" generated respectively by the fan 120C flow out from the first flow outlet N4" and the second flow outlet N3. The heat dissipation element 140 is located between the second flow outlet N3 and the opening 111c. The air flow F3'" flowing from the second flow outlet N3 passes through the heat dissipation element 140 and flows out of the body 110D through the opening 111c, and the air flow F4'" flowing from the first flow outlet N4" passes through the heat sources 11 and 12 and then flows out of the body 110D through the opening 111d.

Figure 6:
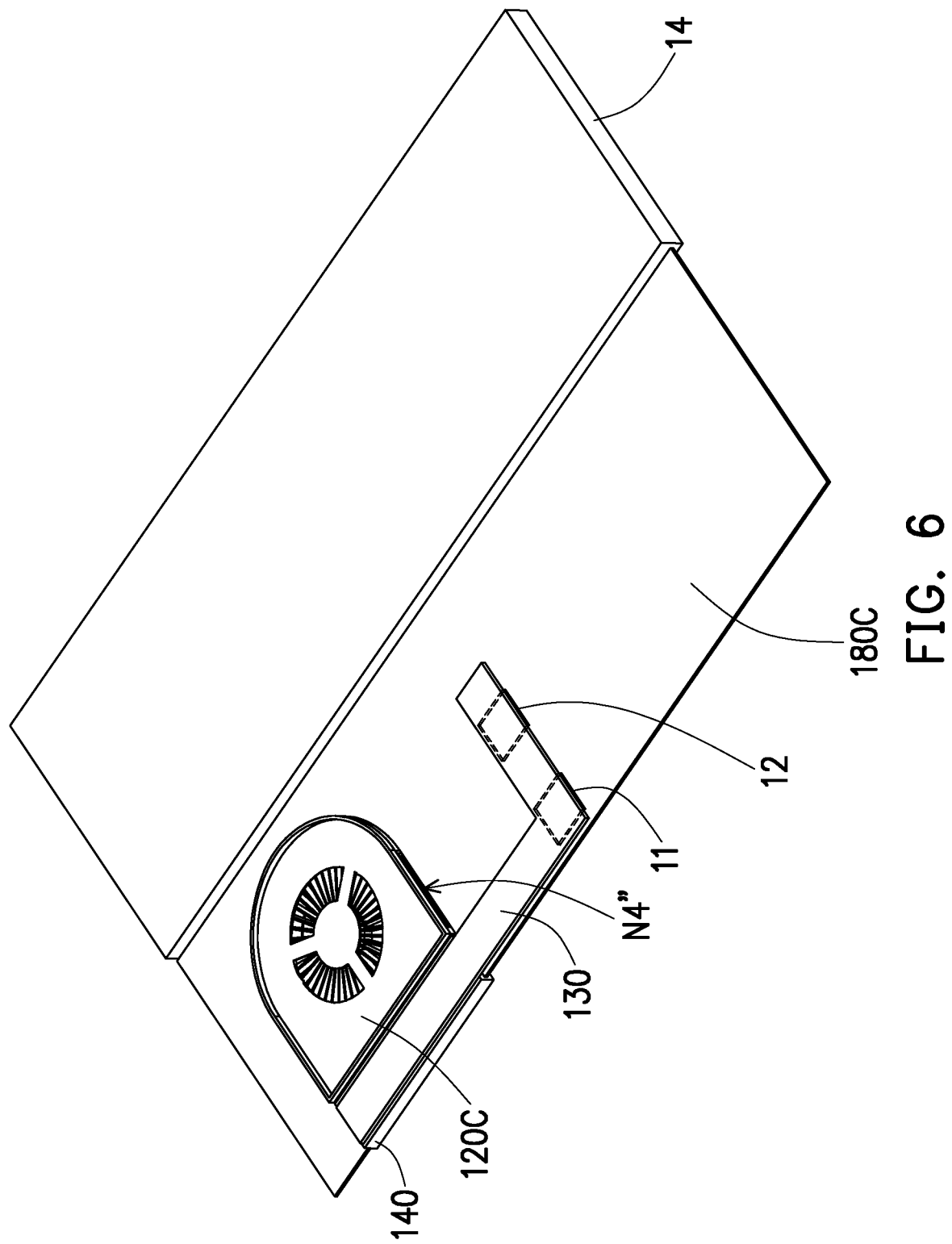
FIG. 6 is a schematic diagram of a heat dissipation system according to another embodiment of the disclosure.

FIG. 6 is a schematic diagram of a heat dissipation system according to another embodiment of the disclosure. It should be noted that in the embodiment shown in FIG. 6, the drawing of the body is omitted to more clearly illustrate the internal structure thereof. Different from the heat sources 11 and 12 and the heat conducting element 130 in FIG. 4A and FIG. 5A that are disposed at the lower surface of the circuit board 180C, in the embodiment shown in FIG. 6, the heat sources 11 and 12 and the heat conducting element 130 may also be disposed at the upper surface of the circuit board 180C. That is to say, the heat sources 11 and 12 as well as the heat conducting element 130 are located on the same layer as the first flow outlet N4", which facilitates the first flow outlet N4" to perform effective heat dissipation actions on the heat sources 11 and 12.

In summary, the heat dissipation system of the portable electronic device of the disclosure uses a centrifugal fan with corresponding spacing members to form a stratified air flow in the body along the axial direction, so as to ensure that the air flow sucked into the fan is not in conflict with the heat dissipation airflow route generated by the fan, and effectively prevents the heat generated by the heat sources from being sucked into the fan again, thereby providing an alternative solution for improving the heat accumulation problem caused by conflict of heat dissipation routes in the existing body.

Although the present disclosure has been disclosed in the above embodiments, it is not intended to limit the present disclosure, and those skilled in the art can make some modifications and refinements without departing from the spirit and scope of the disclosure. Therefore, the scope of the present disclosure is subject to the definition of the scope of the appended claims.

What is claimed is:

1. A heat dissipation system of a portable electronic device, comprising:
    a body, in which at least one heat source of the portable electronic device is arranged;
    at least one fan, which is a centrifugal fan, arranged in the body, wherein the fan has at least one flow inlet located in an axial direction and at least one flow outlet located in a radial direction; and
    at least one spacing member, disposed on at least one of the body or the fan to form a stratified air flow in the body along the axial direction, wherein the stratified air flow flows into the fan through the flow inlet and flows out of the fan through the flow outlet.

2. The heat dissipation system of the portable electronic device according to claim 1, wherein the at least one spacing member comprises a first spacing member arranged on part of a periphery of the fan and a second spacing member arranged on an inner wall of the body, the first spacing member, the second spacing member, the body and the fan form an inflow channel, and the inflow channel is connected to the flow inlet.

3. The heat dissipation system of the portable electronic device according to claim 2, wherein the inflow channel and the flow outlet are located on opposite sides of the fan.

4. The heat dissipation system of the portable electronic device according to claim 2, wherein the first spacing member forms a notch on an outer surface of the fan, and the notch and the flow outlet are located on different sides of the fan.

5. The heat dissipation system of the portable electronic device according to claim 2, wherein the fan has two flow outlets located in different radial directions, one of the flow outlets faces the outside of the body, and the other flow outlet faces the inside of the body, and the two flow outlets have the same opening size along the axial direction.

6. The heat dissipation system of the portable electronic device according to claim 1, further comprising a circuit board, wherein the at least one spacing member comprises a first spacing member arranged on part of a periphery of the fan and a second spacing member arranged on an inner wall of the body, the first spacing member, the second spacing member, the body, the fan and the circuit board form an inflow channel, and the inflow channel is connected to the flow inlet.

7. The heat dissipation system of the portable electronic device according to claim 6, wherein the inflow channel and the flow outlet are located on the same side of the fan.

8. The heat dissipation system of the portable electronic device according to claim 6, wherein the first spacing member forms a notch on the fan, and the notch and the flow outlet are located on the same side of the fan.

9. The heat dissipation system of the portable electronic device according to claim 6, wherein the fan has two flow outlets located in different radial directions, one of the flow outlets faces the outside of the body, and the other flow outlet faces the inside of the body, and the two flow outlets have different opening sizes along the axial direction.

10. The heat dissipation system of the portable electronic device according to claim 6, wherein the fan has two flow outlets located in different radial directions, one of the flow outlets faces the outside of the body, and the other flow outlet faces the inside of the body, and the two flow outlets have the same opening size along the axial direction.

11. The heat dissipation system of the portable electronic device according to claim 10, wherein the flow outlet facing the inside of the body and the inflow channel are located on the same side of the fan.

12. The heat dissipation system of the portable electronic device according to claim 10, wherein the flow outlet facing the inside of the body has a first sub-flow outlet and a second sub-flow outlet, and an opening size of the first sub-flow outlet along the axial direction is smaller than an opening size of the second sub-flow outlet.

13. The heat dissipation system of the portable electronic device according to claim 12, wherein the fan further has a side wall, which is located between the first sub-flow outlet and the inflow channel along the axial direction.

14. The heat dissipation system of the portable electronic device according to claim 1, wherein an orthographic projection of the inflow channel in the axial direction and an orthographic projection of the flow outlet in the axial direction are staggered.

15. The heat dissipation system of the portable electronic device according to claim 1, wherein the spacing member is a circuit board, which is arranged in the body and annularly connected to at least a part of the fan to stratify an internal space of the body, and the flow outlet is located at one of the layers.

16. The heat dissipation system of the portable electronic device according to claim 15, wherein the fan abuts against the body along the axial direction.

17. The heat dissipation system of the portable electronic device according to claim 15, further comprising another spacing member arranged along a periphery of the fan and abutting between the fan and the body.

18. The heat dissipation system of the portable electronic device according to claim 15, wherein the fan has two flow outlets located in different radial directions, one of the flow outlets faces the outside of the body, and the other flow outlet faces the inside of the body and is located at one of the layers, the entire fan except for the flow outlet facing the outside of the body is all annularly connected to the circuit board.

19. The heat dissipation system of the portable electronic device according to claim 18, further comprising a heat dissipation fin disposed in the body and facing forward the flow outlet facing the outside of the body, the heat dissipation fin and the circuit board form a closed contour, and the fan is located in the closed contour.

20. The heat dissipation system of the portable electronic device according to claim 15, wherein another layer of the internal space of the body is not provided with the flow outlet, the body further has a plurality of openings located at another layer.

* * * * *